United States Patent
Yang et al.

(10) Patent No.: US 9,618,659 B2
(45) Date of Patent: Apr. 11, 2017

(54) DISPLAY PANEL, MANUFACTURING METHOD OF THE SAME, AND TERMINAL APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Yiming Zhao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 2 days.

(21) Appl. No.: 14/422,808

(22) PCT Filed: Apr. 25, 2014

(86) PCT No.: PCT/CN2014/076243
§ 371 (c)(1),
(2) Date: Feb. 20, 2015

(87) PCT Pub. No.: WO2015/035782
PCT Pub. Date: Mar. 19, 2015

(65) Prior Publication Data
US 2016/0041310 A1 Feb. 11, 2016

(30) Foreign Application Priority Data
Sep. 13, 2013 (CN) .......................... 2013 1 0416498

(51) Int. Cl.
*G02F 1/1335* (2006.01)
*G02B 3/00* (2006.01)
(Continued)

(52) U.S. Cl.
CPC ............. *G02B 3/0037* (2013.01); *G02F 1/13* (2013.01); *G02F 1/13306* (2013.01);
(Continued)

(58) Field of Classification Search
CPC ................................................. G02F 1/133512
See application file for complete search history.

(56) References Cited

U.S. PATENT DOCUMENTS

2010/0109988 A1* 5/2010 Kao .................. G02F 1/133526
345/87
2011/0317121 A1* 12/2011 Lin .................... G02F 1/133512
349/158
(Continued)

FOREIGN PATENT DOCUMENTS

| CN | 102184678 A | 9/2011 |
|----|-------------|--------|
| CN | 102540565 A | 7/2012 |

(Continued)

OTHER PUBLICATIONS

Written Opinion of the International Searching Authority dated Aug. 13, 2014 corresponding to International application No. PCT/CN2014/076243.
(Continued)

*Primary Examiner* — Paisley L Arendt
*Assistant Examiner* — Edmond Lau
(74) *Attorney, Agent, or Firm* — Nath, Goldberg & Meyer; Joshua B. Goldberg

(57) ABSTRACT

A display panel according to the present invention includes a first substrate and a second substrate which are arranged opposite to each other, and an outer surface of the second
(Continued)

substrate includes a display region and a border region surrounding the display region. Wherein, the display panel further includes a plurality of light guides provided on the outer surface of the second substrate, and the light guides include first light guides, which are provided at edges of the display region so as to guide light emitted from the edges of the display region towards an upside of at least a part of the border region. Since the first light guides guide light emitted from the edges of the display region towards an upside of at least a part of the border region, display with a narrow border or even display without a border can be achieved.

8 Claims, 3 Drawing Sheets

(51) Int. Cl.
G02F 1/13 (2006.01)
H01L 31/0224 (2006.01)
G02F 1/133 (2006.01)
H01L 27/32 (2006.01)
H01L 31/0216 (2014.01)
G02F 1/1333 (2006.01)

(52) U.S. Cl.
CPC .. *G02F 1/133512* (2013.01); *G02F 1/133514* (2013.01); *G02F 1/133526* (2013.01); *H01L 27/3227* (2013.01); *H01L 31/02167* (2013.01); *H01L 31/022425* (2013.01); *G02F 2001/13324* (2013.01); *G02F 2001/133357* (2013.01)

(56) References Cited

U.S. PATENT DOCUMENTS

| | | | |
|---|---|---|---|
| 2013/0016299 A1* | 1/2013 | Takama | G02F 1/133512 349/57 |
| 2013/0050613 A1 | 2/2013 | Ohshima | |
| 2013/0341659 A1* | 12/2013 | Lin | G02F 1/157 257/91 |
| 2014/0160388 A1* | 6/2014 | Wu | G02F 1/133526 349/43 |

FOREIGN PATENT DOCUMENTS

| | | |
|---|---|---|
| CN | 102879940 A | 1/2013 |
| CN | 103217831 A | 7/2013 |
| CN | 103299356 A | 9/2013 |
| CN | 103473997 A | 12/2013 |

OTHER PUBLICATIONS

Notification of the First Office Action dated Oct. 14, 2014 corresponding to Chinese application No. 201310416498.5.
International Search Report for International Application No. PCT/CN2014/076243.

* cited by examiner

DISPLAY PANEL, MANUFACTURING METHOD OF THE SAME, AND TERMINAL APPARATUS

This is a National Phase Application filed under 35 U.S.C. 371 as a national stage of PCT/CN2014/076243, filed Apr. 25, 2014, an application claiming the benefit of Chinese Application No. 201310416498.5, filed Sep. 13, 2013, the content of each of which is hereby incorporated by reference in its entirety.

FIELD OF THE INVENTION

The present invention relates to the field of electronic apparatus, in particular, relates to a display panel, a terminal apparatus including the display panel, and a manufacturing method of the display panel.

BACKGROUND OF THE INVENTION

Many electronic terminal apparatuses include a display panel used for displaying. The display panel includes a display region and a border region surrounding the display region. The display region displays images and characters when a terminal apparatus is in use. The terminal apparatus includes a display panel, a backlight, and a front frame, which is used for assembling the backlight and the display panel together, and covers the border region of the display panel. The presence of the border region limits a size of a picture displayed by the display panel in each screen or amount of information displayed by the display panel in each screen.

The demand for a display panel with a narrow border or even without a border increases gradually with a viewer's increasing pursuit of better visual experience. An existing terminal apparatus realizing display without a border is achieved mainly by removing a front frame and attaching a display panel to a backlight directly. In such a configuration, however, the bond between the display panel and the backlight is not firm enough.

SUMMARY OF THE INVENTION

An object of the present invention is to provide a display panel, a terminal apparatus including the display panel, and a manufacturing method of the display panel, wherein, the display panel can achieve display with a narrow border or even display without a border.

In order to achieve the above object, as one aspect of the present invention, there is provided a display panel including a first substrate and a second substrate which are arranged opposite to each other, and an outer surface of the second substrate includes a display region and a border region surrounding the display region, wherein, the display panel further includes a plurality of light guides provided on the outer surface of the second substrate, the light guides include first light guides, which are provided at edges of the display region so as to guide light emitted from the edges of the display region towards an upside of at least a part of the border region.

Preferably, each of the first light guides is a columnar element and includes a mounting surface, a refraction surface, and a connection surface connecting the mounting surface and the refraction surface, the mounting surface is attached to the outer surface of the second substrate, a distance between each of points on the refraction surface and the connection surface gradually increases from top to bottom, and light emitted from the edges of the display region travels from the refraction surfaces towards an upside of the border region after being refracted by the first light guides.

Preferably, the border region includes functional sections and connection sections, the functional sections are respectively located at two opposite sides of the border region, the connection sections are respectively located at remaining two sides of the border region and are connected between the functional sections located at the two opposite sides, each of the first light guides which extend along a length direction of each of the connection sections is arranged adjacent to each of the connection sections located at the remaining two sides; and/or, each of the first light guides which extend along a length direction of each of the functional sections is arranged adjacent to each of the functional sections located at the two opposite sides.

Preferably, the light guides further include second light guides provided on the outer surface of the second substrate, the second light guides are located between the first light guides arranged opposite to each other, bottom surfaces of the first light guides and the second light guides cover the display region, and a magnification of each of the second light guides is the same as that of each of the first light guides.

Preferably, the display panel further includes a solar cell, which is provided on the outer surface of the second substrate and at an inner side of each of the second light guides.

Preferably, the display panel further includes a planarization layer provided on the outer surface of the second substrate, the planarization layer covers the outer surface of the second substrate and the solar cell, an outer surface of the planarization layer is a plane, and the light guides are arranged on the planarization layer.

Preferably, the display panel is a liquid crystal display panel, an organic electroluminescent display panel, or an electrochromic display panel.

Preferably, in a case where the display panel is the liquid crystal display panel, a material of liquid crystal is filled between the first substrate and the second substrate, a black matrix and a color filter layer are provided at an inner side of the second substrate, and the solar cell is arranged on the second substrate at a position corresponding to the black matrix.

Preferably, in a case where the display panel is the organic electroluminescent display panel, organic light-emitting diodes are provided on the first substrate with an interval therebetween, and the solar cell is arranged on the second substrate at a position corresponding to a gap between two adjacent ones of the organic light-emitting diodes.

Preferably, the planarization layer, the first light guides and the second light guides are made of a same material.

As another aspect of the present invention, there is provided a terminal apparatus including a display panel, wherein, the display panel is the display panel according to the present invention.

As still another aspect of the present invention, there is provided a manufacturing method of a display panel, including a step of assembling a first substrate and a second substrate to form a cell, an outer surface of the second substrate including a display region and a border region surrounding the display region, wherein, the manufacturing method further includes the following step:

providing light guides, so that the light guides include first light guides, which are provided at edges of the display region so as to guide light emitted from the edges of the display region towards an upside of at least a part of the border region.

Preferably, the border region includes functional sections and connection sections, the functional sections are respectively located at two opposite sides of the border region, the connection sections are respectively located at remaining two sides of the border region and are connected between the functional sections located at the two opposite sides, the light guides further include second light guides, and the manufacturing method further includes the following steps:

arranging each of the first light guides along a length direction of each of the connection sections and adjacent to each of the connection sections located at the remaining two sides; and/or, arranging each of the first light guides which extend along a length direction of each of the functional sections and adjacent to each of the functional sections located at the two opposite sides; and arranging the second light guides between the first light guides arranged opposite to each other, so that bottom surfaces of the first light guides and the second light guides cover the display region, and a magnification of each of the second light guides is the same as that of each of the first light guides.

Preferably, the manufacturing method further includes a step of providing a solar cell and a step of forming a planarization layer which are performed successively before the step of providing light guides, so that the solar cell is provided on the outer surface of the second substrate, the planarization layer covers the outer surface of the second substrate and the solar cell, an outer surface of the planarization layer is a plane, and the light guides are arranged on the outer surface of the planarization layer.

Light emitted from edges of the display region (i.e., light emitted by backlights under the edges of the display region) travels to the first light guides, and light emitted from respective regions in the display region is refracted by the corresponding first light guides, so that the light can be guided towards an upside of at least a part of the border region. When viewing the displayed picture, a viewer can see an image formed by the light from the upside of the at least a part of the border region. Thus display with a narrow border or even display without a border can be achieved.

BRIEF DESCRIPTION OF THE DRAWINGS

The drawings are for the purpose of providing further understanding of the present invention, and constitute a part of the description. The drawings are used for explaining the present invention together with the following embodiments, but are not intended to limit the present invention. Wherein, FIGS. 1(a) to 1(d) are flow charts showing a manufacturing method of a display panel according to the present invention, wherein, FIG. 1(d) is a sectional view of a display panel according to the present invention;

REFERENCE SIGNS

| 10: first substrate | 20: second substrate |
|---|---|
| 21: black matrix | 22: color filter layer |
| 30: solar cell | 41: first light guide |
| 42: second light guide | 50: planarization layer |
| 100: display region | 200: border region |
| 210: functional section | 220: connection section |
| 41a: mounting surface | 41b: refraction surface |
| 41c: connection surface | |

DETAILED DESCRIPTION OF THE EMBODIMENTS

Embodiments of the present invention will be described in detail with reference to the drawings. It should be noted that, the embodiments described herein are merely for the purpose of explaining and illustrating the present invention, but are not intended to limit the present invention.

Figure 1A:
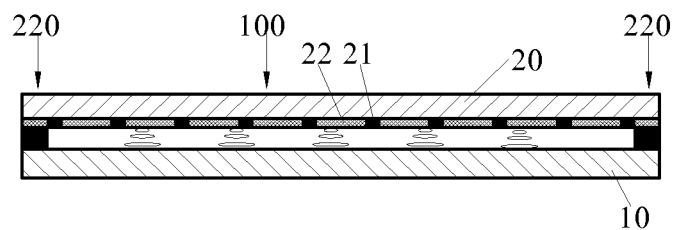
Figure 1B:
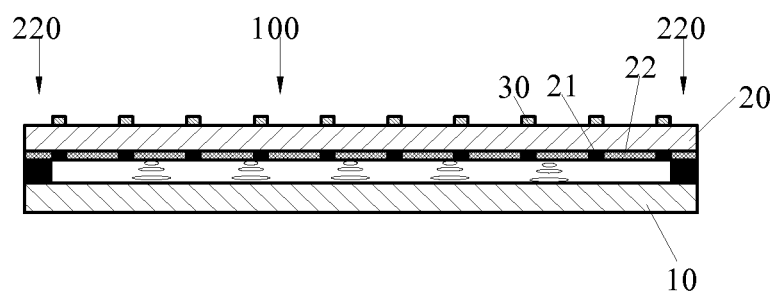
Figure 1C:
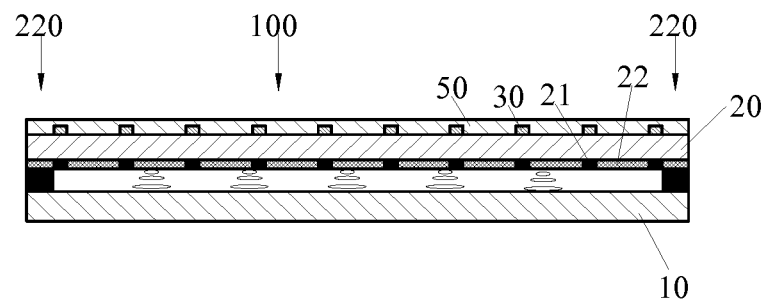
Figure 1D:
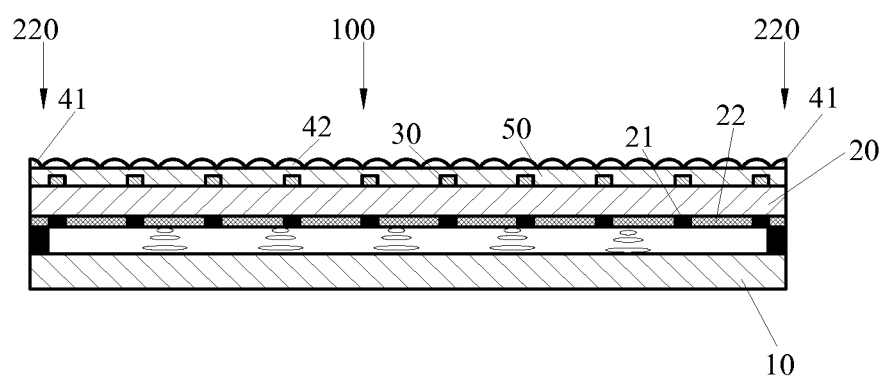
Figure 2:
FIG. 2 is a top view of an implementation of the display panel according to the present invention.

As shown in FIGS. 1(d) and 2, as one aspect of the present invention, there is provided a display panel. The display panel includes a first substrate 10 and a second substrate 20 which are arranged opposite to each other, and an outer surface of the second substrate 20 includes a display region 100 and a border region 200 surrounding the display region 100. Wherein, the display panel further includes a plurality of light guides provided on the outer surface of the second substrate 20. The light guides include first light guides 41, which are provided at edges of the display region 100 so as to guide light L1 emitted from the edges of the display region 100 towards an upside of at least a part of the border region 200. Wherein, the display region 100 is a rectangle, and the border region 200 is a rectangular frame.

It should be noted that, "first light guides 41, which are provided at edges of the display region 100" can be understood as that the first light guides 41 are provided at the junction of the display region 100 and the border region 200, that all of the first light guides 41 may be located in the display region 100, or that some of the first light guides 41 may be located in the display region 100 and the rest may be located in the border region 200.

Figure 4:
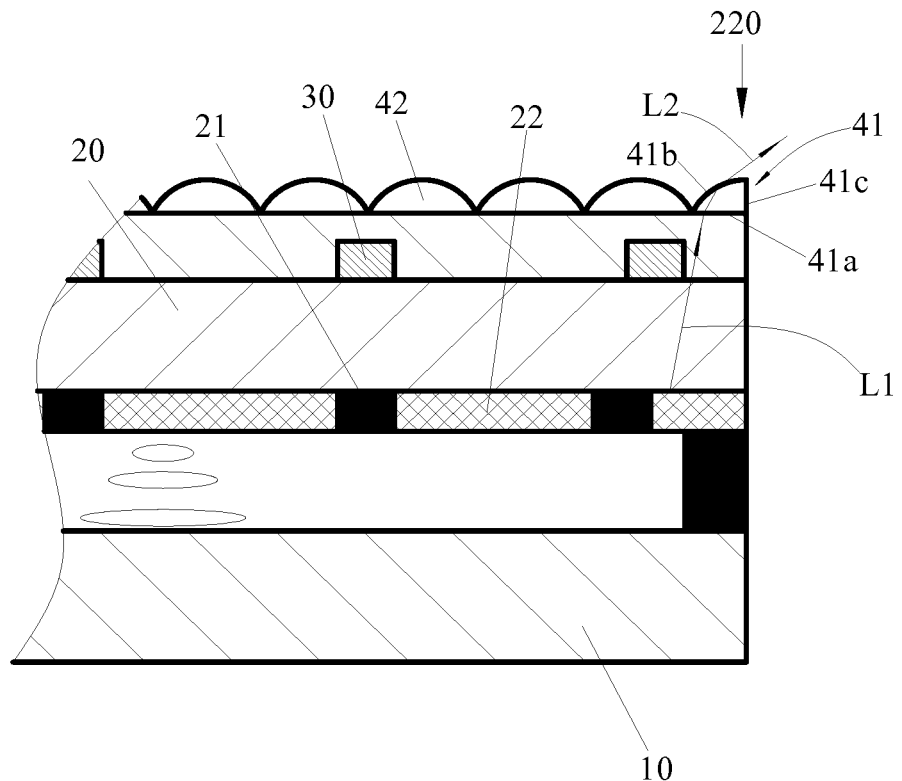
FIG. 4 is a diagram showing the principle that the display panel according to the present invention achieves display without a border.

As shown in FIG. 4, the light L1 emitted from the edges of the display region 100 (i.e., light emitted by backlights under the edges of the display region 100) travels to the first light guides 41, and is refracted by the first light guides 41, so that the light L1 can be guided towards an upside of at least a part (e.g., connection sections 220 as shown in FIG. 4) of the border region, to become emergent light L2. When viewing the displayed picture, a viewer can see an image formed by the light from the upside of the at least a part of the border region 200.

In a case where the light guided by the first light guides 41 covers a part of the border region 200, display with a narrow border can be achieved. In a case where the light guided by the first light guides 41 covers the border region 200 completely, display without a border can be achieved.

The display panel according to the present invention can be achieved by providing the first light guides 41 on a display region of a second substrate of an existing display panel. When the display panel is applied to a terminal apparatus, it is not necessary to remove a front frame connecting the display panel and a backlight, thus, the bonding strength between the display panel and the backlight will not be decreased.

In the present invention, there is no special limit on a specific form of each of the first light guides 41, as long as the first light guides 41 can refract the light L1 emitted from the bottom of the edges of the display region 100 towards an upside of the border region 200 so that the light covers at least a part of the border region 200.

For ease of arranging and lowering the overall cost of the display panel, preferably, as shown in FIG. 2, each of the first light guides 41 may be a columnar element, that is, each of the first light guides 41 may be formed as a columnar lens. As shown in FIG. 4, each of the first light guides 41 may include a mounting surface 41a, a refraction surface 41b, and a connection surface 41c connecting the mounting surface 41a and the refraction surface 41b. The mounting surface 41a is attached to the outer surface of the second substrate 20, and the mounting surface 41a and the refraction surface 41b are located at a same side of the connection surface 41c. A distance between each of points on the refraction surface 41b and the connection surface 41c gradually increases from top to bottom (here, the "top" and "bottom" refer to the directions of "top" and "bottom" as shown in FIG. 4; in other words, "from top to bottom" refers to "from a side of the refraction surface 41b which is far away from the mounting surface 41a to a side of the refraction surface 41b which is close to the mounting surface 41a"), so that light emitted from the edges of the display region 100 travels from the refraction surfaces 41b towards an upside of the border region 200 after being refracted by the first light guides 41.

The advantage of the arrangement that each of the first light guides 41 is provided with the mounting surface 41a, the refraction surface 41b, and the connection surface 41c lies in that, light incident into each of the first light guides 41 is refracted substantially in a same direction, facilitating achieving better effect of display with a narrow border or even display without a border. As shown in FIG. 4, the connection surface 41c may be aligned with a side face of the display panel while being perpendicular to an upper surface of the second substrate 20.

Further, there is no special limit on a shape of a transverse section of each of the first light guides 41. Each of the first light guides 41 may be a one-fourth cylinder or a prism, as long as each of the first light guides 41 can refract the light emitted from the bottom of the edges of the display region 100 towards an upside of the border region 200.

In an embodiment of the present invention, a transverse section of each of the first light guides 41 is a quarter of a circle. Alternatively, a transverse section of each of the first light guides 41 may be a right angle trapezoid, and in such a case, it is easily understood that the mounting surface 41a of each of the first light guides 41 is larger than the top surface thereof. Alternatively, a transverse section of each of the first light guides 41 may be a triangle.

As shown in FIG. 2, the border region 200 includes functional sections 210 and connection sections 220. The functional sections 210 are respectively located at two opposite sides (i.e., the left side and the right side as shown in FIG. 2) of the border region 200, and the connection sections 220 are respectively located at remaining two sides (i.e., the upper side and the lower side as shown in FIG. 2) of the border region 200 and are connected between the functional sections 210 located at the two opposite sides (that is, the functional sections 210 and the connection sections 220 are circumferentially arranged to form the border region 200). An extension direction of each of the first light guides 41 is parallel to an extension direction of each of the connection sections 220.

In the present invention, it is feasible to provide only one first light guide 41, which can refract light towards an upside of a connection section 220 adjacent to the one first light guide 41. Preferably, two first light guides 41 may be provided. The two first light guides 41 are arranged so that the refraction surface 41b thereof are opposite to each other and the two first light guides 41 are respectively adjacent to the opposite connection sections 220. The two first light guides 41 can guide light towards the upsides of the connection sections 220 located at two sides, respectively.

When the display panel according to the present invention is arranged in a terminal apparatus, mounting holes for mounting functional components (e.g., a front camera, an earpiece, a microphone) of the terminal apparatus will be provided in the functional sections 210. Further, various circuit boards, connecting lines, and the like (e.g., a driving circuit of the display panel) are also provided under the functional sections 210. In such an implementation, it only needs to guide light towards the upsides of the connection sections 220 by the first light guides 41. The advantage of the arrangement that the extension direction of each of the first light guides 41 is arranged to be parallel to the extension direction of each of the connection sections 220 lies in that, the arrangement of the first light guides 41 can be simplified. Preferably, each of the first light guides 41 which extend along a length direction of each of the connection sections 220 is arranged adjacent to each of the connection sections 220 located at two sides.

Further, mounting holes for mounting functional components of the terminal apparatus may be provided in a side face or other positions of the display panel, and two first light guides 41 may be respectively arranged adjacent to the functional sections 210 located at the two opposite sides, thereby achieving display without a border.

It should be understood that, the two first light guides 41 corresponding to the connection sections 220 and the two first light guides 41 corresponding to the functional sections 210 are arranged to end to end so as to surround the edges of the display region 100.

Figure 3:
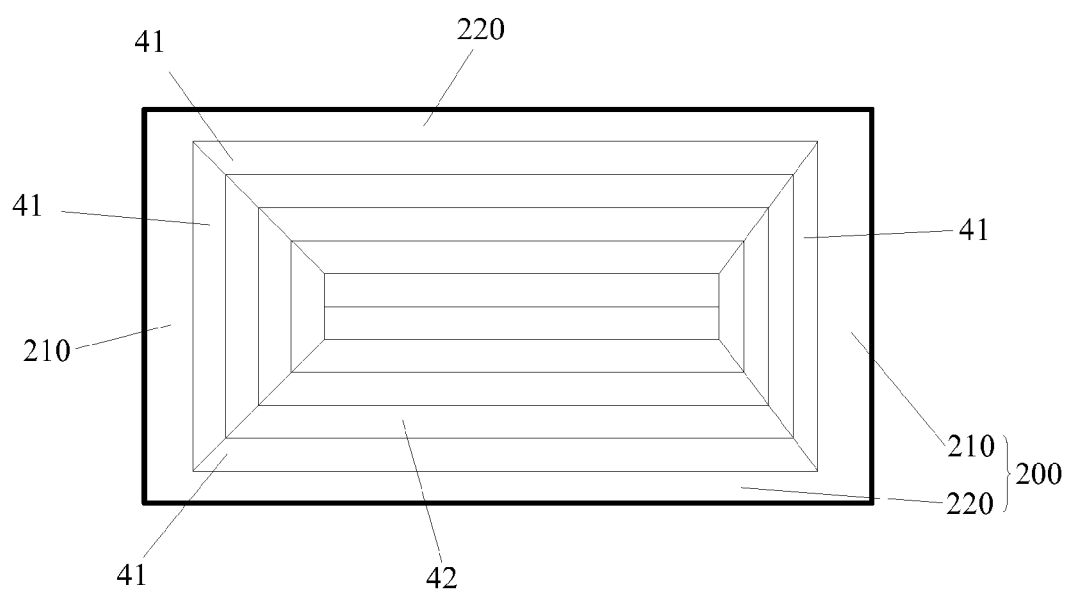
FIG. 3 is a top view of another implementation of the display panel according to the present invention.

It should be understood that, each of the first light guides 41 should be able to ensure the coherence of an image after guiding light emitted from the edges of the display region 100 towards an upside of the border region 200. In order that an image displayed by the display panel has better coherence and a viewer can have an ideal visual experience, preferably, the light guides may further include second light guides 42 provided on the outer surface of the second substrate 20. As shown in FIGS. 2 and 3, the second light guides 42 are located between the first light guides 41 arranged opposite to each other, and a magnification of each of the second light guides 42 is the same as that of each of the first light guides 41.

FIG. 2 shows a top view of the display panel in a case where only the first light guides 41 corresponding to the connection sections 220 are provided. In such an implementation, the second light guides 42 are arranged parallel to each other. FIG. 3 shows a top view of the display panel in a case where the first light guides 41 corresponding to the connection sections 220 and the first light guides 41 corresponding to the functional sections 210 are provided. In such an implementation, the second light guides 42 parallel to the connection sections 220 and the second light guides 42 parallel to the functional sections 210 are arranged.

After the second light guides 42 are arranged between the first light guides 41 located at two sides, various parts of an image displayed on the whole display region 100 can be magnified equally, so that a viewer can see an image having better coherence. Thus, an ideal visual effect is achieved. It should be understood that, bottom surfaces of the first light guides and those of the second light guides cover the whole display region 100. It is easily understood that, each of the second light guides 42 may also be a columnar element.

In the present invention, a shape of each of the second light guides 42 may be the same as a shape obtained by attaching the connection surfaces of two first light guides 41 to each other. For example, in a case where each of the first light guides 41 is a one-fourth cylinder, each of the second light guides 42 may be a half cylinder. In a case where a transverse section of each of the first light guides 41 is a right angle trapezoid, a transverse section of each of the second light guides 42 may be an isosceles trapezoid.

Figure 5:
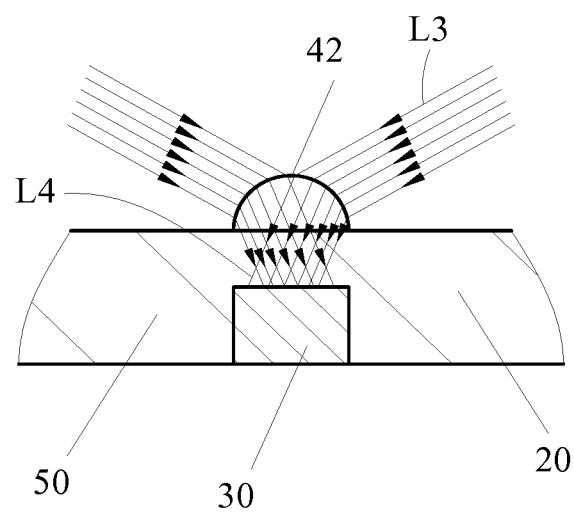
FIG. 5 is a diagram showing the principle that a light guide in the display panel according to the present invention converges light.

In order to increase the power-supply durability of a terminal apparatus employing the display panel according to the present invention, preferably, the display panel may further include solar cells 30, which may be provided on the outer surface of the second substrate 20, so that electric power can be generated through solar energy collected by light-collecting surfaces of the solar cells 30, and the electric power is supplied to the terminal apparatus including the display panel. The solar cells 30 may be arranged at an inner side (i.e., the bottom as shown in FIG. 5) of each of the second light guides 42. Thus, on one hand, the solar cells 30 will not block the light emitted from the edges of the display region 100; on the other hand, the second light guides 42 can converge the sunlight L3 outside of the display panel onto the light-collecting surfaces of the solar cells 30, that is, the sunlight L3 input from the outside of the display panel becomes incident light L4 with relatively high convergence after being refracted by the second light guides 42, so that the total amount of the solar energy collected by the solar cells 30 can be increased (as shown in FIG. 5).

It should be understood that, in the present invention, "inner" refers to a direction directing to the inside of display panel, and "outer" refers to a direction directing to the outside of display panel. The solar cells 30 generate electric power by using solar energy collected by the light-collecting surfaces thereof, so as to provide the electric power to a driving circuit of the display panel, or charge a power supply of a terminal apparatus including the display panel. Thus, the power-supply durability of a terminal apparatus including the display panel according to the present invention can be increased.

It is easily understood that, in an implementation in which the solar cells 30 are provided, corresponding circuit structures should be provided on the outer surface of the second substrate 20. Thus, the electric power generated by the solar cells 30 is output and supplied to the terminal apparatus.

The present invention has no special limit on a specific type of the display panel. The display panel may be a liquid crystal display panel, an organic electroluminescent display panel, an electrochromic display panel, or the like. Generally, as shown in FIG. 1(d), the display panel may include the first substrate 10 and the second substrate 20 which are arranged opposite to each other, and the solar cells 30 are provided on the outer surface of the second substrate 20.

Of course, the solar cells 30 may be provided on the first substrate 10, or may be provided on both the first substrate 10 and the second substrate 20, as long as the solar energy can by collected by the light-collecting surfaces thereof to generate electric power.

In a case where the display panel is the liquid crystal display panel, a material of liquid crystal is filled between the first substrate 10 and the second substrate 20, and a black matrix 21 and a color filter layer 22 are provided at an inner side of the second substrate 20. In order that the display panel has a high aperture ratio, preferably, the solar cells 30 may be arranged on the second substrate 20 at a position corresponding to the black matrix 21.

In a case where the display panel is the organic electroluminescent display panel, organic light-emitting diodes are provided on the first substrate 10 with an interval therebetween, and the solar cells 30 may be arranged on the second substrate 20 at a position corresponding to a gap between two adjacent ones of the organic light-emitting diodes.

The light guides may be arranged on outer surfaces of the solar cells 30 directly. Alternatively, in order to ensure that the light guides are firmly fixed on the display panel, a planarization layer 50 may be provided on the outer surface of the second substrate 20. The planarization layer 50 covers the outer surfaces of the solar cells 30 and the second substrate 20, and an outer surface (a surface of the planarization layer 50 which is attached to the outer surface of the second substrate 20 is an inner surface of the planarization layer 50, and a surface opposite to the inner surface of the planarization layer 50 is an outer surface of the planarization layer 50) of the planarization layer 50 is a plane. By arranging the light guides on the outer surface of the planarization layer 50, the light guides can be fixed in the display panel more firmly. The planarization layer 50, the first light guides, and the second light guides may be made of a same material, so that the bonding strength between the first light guides or the second light guides and the planarization layer 50 can be increased, thereby preventing the first light guides and the second light guides from separating from the planarization layer 50.

In an implementation in which the light guides include the second light guides 42, since the outer surface of the planarization layer 50 is a plane, the first light guides 41 and the second light guides 42 can be more uniform. Thus, magnification effect of an image displayed by the display panel is also uniform, so that a viewer can have a better visual experience.

In the present invention, there is no special limit on a specific material forming the first light guides 41, the second light guides 42, and the planarization layer 50. As long as the planarization layer 50 is transparent and can be fixed on the outer surface of the second substrate 20. Similarly, as long as the first light guides 41 and the second light guides 42 are transparent and can be fixed on the outer surface of the second substrate 20.

Fox example, the planarization layer 50 and/or the first and second light guides 41 and 42 may be made of a material of thermosetting resin. Alternatively, the planarization layer 50 and/or the first and second light guides 41 and 42 may be made of a light-cured material.

As another aspect of the present invention, there is provided a terminal apparatus including a display panel, wherein, the display panel is the display panel according to the present invention.

As described above, the first light guides are provided on a light-outgoing surface of the display panel, so that light emitted from the display region of the display panel can be guided towards an upside of the border region. Thus, display with a narrow border or even display without a border can be achieved.

In an implementation in which a solar cell is provided, the solar cell may be connected to a driving device (e.g., a gate driver or a source driver) of the display panel, so as to provide electric power required for driving the display panel.

Alternatively, the solar cell may be connected to a power supply of a terminal apparatus directly, and is used for charging the power supply. A circuit structure can be simplified by connecting the solar cell to the power supply directly, and thus is easy to achieve. For example, a positive electrode of the solar cell is connected to a positive electrode of the power supply directly, and a negative electrode of the solar cell is connected to a negative electrode of the power supply directly.

As still another aspect of the present invention, there is provided a manufacturing method of a display panel. As shown in FIGS. 1(a) to 1(d) and 2, the display panel includes the first substrate 10 and the second substrate 20, and the outer surface of the second substrate includes the display region 100 and the border region 200 surrounding the display region 100. The manufacturing method includes a step of:

providing light guides (as shown in FIG. 1(d)), so that the light guides include the first light guides 41, which are provided at the edges of the display region 100 so as to guide the light emitted from the edges of the display region 100 towards an upside of at least a part of the border region 200.

In should be understood that, the manufacturing method further includes a step of assembling the first substrate 10 and the second substrate 20 to form a cell before the step of providing light guides (as shown in FIG. 1(a)).

The light guides may be provided in many ways. For example, the light guides may be formed by a patterning process, or by a roll-to-roll transfer process. Alternatively, the light guides may be formed in advance by a machining process, and then attached to the outer surface of the second substrate 20 of the display panel.

As described above, for the purpose of easy manufacturing and lowering the overall cost of the display panel, preferably, each of the first light guides 41 may be a columnar element. Further, the present invention has no special limit on a shape of a transverse section of each of the first light guides 41, as long as each of the first light guides 41 can guide the light emitted from the edges of the display region 100 towards an upside of at least a part of the border region 200. As shown in FIG. 4, each of the first light guides 41 may include the mounting surface 41a, the refraction surface 41b, and the connection surface 41c connecting the mounting surface 41a and the refraction surface 41b. The mounting surface 41a is attached to the outer surface of the second substrate 20, and the mounting surface 41a and the refraction surface 41b are located at a same side of the connection surface 41c. A distance between each of points on the refraction surface 41b and the connection surface 41c gradually increases from top to bottom (here, the "top" and "bottom" refer to the directions of "top" and "bottom" as shown in FIG. 4; in other words, "from top to bottom" refers to "from a side of the refraction surface 41b which is far away from the mounting surface 41a to a side of the refraction surface 41b which is close to the mounting surface 41a"), so that the light emitted from the edges of the display region 100 travels from the refraction surfaces 41b towards an upside of the border region 200 after being refracted by the first light guides 41.

The advantage of the arrangement that each of the first light guides 41 is provided with the mounting surface 41a, the refraction surface 41b, and the connection surface 41c lies in that, light incident into each of the first light guides 41 is refracted substantially in a same direction, facilitating achieving better effect of display with a narrow border or even display without a border. As shown in FIG. 4, the connection surface 41c may be aligned with a side face of the display panel.

As described above and shown in FIG. 2, the border region 200 includes the functional sections 210 and the connection sections 220. The functional sections 210 are respectively located at two opposite sides (i.e., the left side and the right side as shown in FIG. 2) of the border region 200, and the connection sections 220 are respectively located at remaining two sides (i.e., the upper side and the lower side as shown in FIG. 2) of the border region 200 and are connected between the functional sections 210 located at the two opposite sides (that is, the functional sections 210 and the connection sections 220 are circumferentially arranged to form the border region 200). Each of the first light guides 41 may be arranged along a length direction of each of the connection sections 220 and adjacent to each of the connection sections 220 located at the remaining two sides.

Alternatively, each of the first light guides 41 can be arranged along a length direction of each of the functional sections 210 and adjacent to each of the functional sections 210 located at the two opposite sides.

As shown in FIG. 3, both the first light guides 41 parallel to the connection sections 220 and the first light guides 41 parallel to the functional sections 210 may be provided.

The functional sections 210 and the connection sections 220 have been described in detail above, and redundant description is omitted herein.

In order that an image displayed by the display panel has better coherence and a viewer can have an ideal visual experience, preferably, the light guides may further include the second light guides 42 provided between the first light guides 41 arranged opposite to each other, so that bottom surfaces of the first light guides 41 and those of the second light guides 42 cover the display region 100. A magnification of each of the second light guides 42 is the same as that of each of the first light guides 41.

It should be understood that, the second light guides 42 may be arranged in the same manner as a manner in which the first light guides 41 are arranged. Further, the first light guides 41 and the second light guides 42 may be arranged simultaneously in a same step. Alternatively, the first light guides 41 may be arrange firstly, and the second light guides 42 may be arranged subsequently.

In order to increase the power-supply durability of a terminal apparatus including the display panel, preferably, the manufacturing method further includes the following step before the step of providing the first light guides 41:

a step of providing a solar cell 30 (as shown in FIG. 1(b)), so that the solar cell 30 is located on the outer surface of the second substrate.

The outer surface of the second substrate 20 is located at an outer side of the second substrate 20, and the solar cell 30 is arranged on the outer surface of the second substrate 20.

Of course, the solar cell 30 may be arranged on the first substrate 10, as long as it can collect the solar energy by its light-collecting surface to generate electric power without affecting normal display of the display panel.

For ease of arranging the light guides, preferably, the manufacturing method may further include a step of forming a planarization layer 50 between the step of providing the solar cell 30 and the step of providing the light guides, so that the planarization layer 50 covers the outer surface of the second substrate 20 and the solar cell 30, an outer surface of the planarization layer 50 is a plane, and the light guides are arranged on the outer surface of the planarization layer 50.

It is easily understood that, the step of providing the solar cell 30 and the step of forming the planarization layer 50 are performed successively before the step of providing the light guides.

As described above, the planarization layer 50 may be made of a material of thermosetting resin or a light-cured material. When the planarization layer 50 is made of a material of thermosetting resin, the material of thermosetting resin may be coated on the outer surface of the second substrate 20 firstly, and then the second substrate 20 is heated so that the planarization layer 50 is cured. When the planarization layer 50 is made of a light-cured material, the light-cured material may be coated on the outer surface of the second substrate 20 firstly, and then the light-cured material is irradiated by ultraviolet light to be cured, thereby obtaining the planarization layer 50.

Similarly, the first light guides 41 and the second light guides 42 may be made of a material of thermosetting resin or a light-cured material. When the first light guides 41 and the second light guides 42 is made of a light-cured material, the light-cured material may be coated on the outer surface of the planarization layer 50 firstly, next, the light-cured material is exposed by a patterning process, then light-cured material is developed by an etching solution, thereby forming the first light guides 41 and the second light guides 42. When the first light guides 41 and the second light guides 42 is made of a material of thermosetting resin, the preformed (uncured) first light guides 41 and second light guides 42 may be provided on the outer surface of the planarization layer 50 firstly, and then the preformed (uncured) first light guides 41 and second light guides 42 are heated so as to be cured and fixed on the planarization layer 50.

It should be understood that, the above embodiments are only exemplary embodiments for the purpose of explaining the principle of the present invention, and the present invention is not limited thereto. For a person having ordinary skill in the art, various improvements and modifications may be applied to the present invention without departing from the spirit and essence of the present invention. These improvements and modifications also fall within the protection scope of the present invention.

What is claimed is:

1. A display panel including a first substrate and a second substrate which are arranged opposite to each other, and an outer surface of the second substrate includes a display region and a border region surrounding the display region, wherein, the display panel further includes a plurality of light guides provided on the outer surface of the second substrate, the light guides include first light guides, which are provided at edges of the display region so as to guide light emitted from the edges of the display region towards an upside of at least a part of the border region;

wherein, each of the first light guides is a columnar element and includes a mounting surface, a refraction surface, and a connection surface connecting the mounting surface and the refraction surface, the mounting surface is attached to the outer surface of the second substrate, a distance between each of points on the refraction surface and the connection surface gradually increases from top to bottom, and light emitted from the edges of the display region travels from the refraction surfaces towards an upside of the border region after being refracted by the first light guides;

wherein, the border region includes functional sections and connection sections, the functional sections are respectively located at two opposite sides of the border region, the connection sections are respectively located at remaining two sides of the border region and are connected between the functional sections located at the two opposite sides, each of the first light guides which extend along a length direction of each of the connection sections is arranged adjacent to each of the connection sections located at the remaining two sides; or each of the first light guides which extend along a length direction of each of the functional sections is arranged adjacent to each of the functional sections located at the two opposite sides; and wherein, the light guides further include second light guides provided on the outer surface of the second substrate, the second light guides are located between the first light guides arranged opposite to each other, bottom surfaces of the first light guides and the second light guides cover the display region, and a magnification of each of the second light guides is the same as that of each of the first light guides, wherein the display panel further includes a solar cell, which is provided on the outer surface of the second substrate and at an inner side of each of the second light guides.

2. The display panel according to claim 1, wherein, the display panel further includes a planarization layer provided on the outer surface of the second substrate, the planarization layer covers the outer surface of the second substrate and the solar cell, an outer surface of the planarization layer is a plane, and the light guides are arranged on the planarization layer.

3. The display panel according to claim 2, wherein, the display panel is a liquid crystal display panel, an organic electroluminescent display panel, or an electrochromic display panel.

4. The display panel according to claim 3, wherein, in a case where the display panel is the liquid crystal display panel, a material of liquid crystal is filled between the first substrate and the second substrate, a black matrix and a color filter layer are provided at an inner side of the second substrate, and the solar cell is arranged on the second substrate at a position corresponding to the black matrix.

5. The display panel according to claim 3, wherein, in a case where the display panel is the organic electroluminescent display panel, organic light-emitting diodes are provided on the first substrate with an interval therebetween, and the solar cell is arranged on the second substrate at a position corresponding to a gap between two adjacent ones of the organic light-emitting diodes.

6. The display panel according to claim 2, wherein, the planarization layer, the first light guides, and the second light guides are made of a same material.

7. A terminal apparatus including a display panel, wherein, the display panel is the display panel according to claim 1.

8. A manufacturing method of a display panel, including a step of assembling a first substrate and a second substrate to form a cell, an outer surface of the second substrate including a display region and a border region surrounding the display region, wherein, the manufacturing method further includes the following step:

providing light guides, so that the light guides include first light guides, which are provided at edges of the display region so as to guide light emitted from the edges of the display region towards an upside of at least a part of the border region;

wherein, the border region includes functional sections and connection sections, the functional sections are respectively located at two opposite sides of the border region, the connection sections are respectively located at remaining two sides of the border region and are connected between the functional sections located at the two opposite sides, the light guides further include second light guides, and the manufacturing method further includes the following steps:

arranging each of the first light guides along a length direction of each of the connection sections and adjacent to each of the connection sections located at the remaining two sides; or, arranging each of the first light guides which extend along a length direction of each of the functional sections and adjacent to each of the functional sections located at the two opposite sides; and arranging the second light guides between the first light guides arranged opposite to each other, so that bottom surfaces of the first light guides and the second light guides cover the display region, and a magnification of each of the second light guides is the same as that of each of the first light guides, wherein the manufacturing method further includes a step of providing a solar cell and a step of forming a planarization layer which are performed successively before the step of providing light guides, so that the solar cell is provided on the outer surface of the second substrate, the planarization layer covers the outer surface of the second substrate and the solar cell, an outer surface of the planarization layer is a plane, and the light guides are arranged on the outer surface of the planarization layer.

* * * * *